(12) United States Patent
Kim

(10) Patent No.: US 6,995,595 B2
(45) Date of Patent: Feb. 7, 2006

(54) DIRECT CONVERSION RECEIVER HAVING A DC OFFSET ELIMINATING FUNCTION

(75) Inventor: Won-Kyung Kim, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/395,930

(22) Filed: Mar. 24, 2003

(65) Prior Publication Data

US 2004/0021494 A1 Feb. 5, 2004

(30) Foreign Application Priority Data

Aug. 5, 2002 (KR) ............... 10-2002-0046189

(51) Int. Cl.
*H03H 11/16* (2006.01)
*H03K 5/13* (2006.01)
*H03K 3/00* (2006.01)

(52) U.S. Cl. ............... 327/254; 327/238; 327/258
(58) Field of Classification Search ........... 327/238, 327/254–258
See application file for complete search history.

(56) References Cited

U.S. PATENT DOCUMENTS

| 3,761,829 | A | * | 9/1973 | Spaulding | ............ 329/311 |
|---|---|---|---|---|---|
| 5,760,622 | A | * | 6/1998 | Ishigaki | ............ 327/113 |
| 6,148,181 | A | * | 11/2000 | Otaka | ............ 455/86 |
| 6,847,255 | B2 | * | 1/2005 | Petrovic et al. | ............ 329/323 |
| 2003/0220086 | A1 | * | 11/2003 | Birkett | ............ 455/260 |

FOREIGN PATENT DOCUMENTS

EP 877476 A1 * 11/1998

* cited by examiner

*Primary Examiner*—Quan Tra
(74) *Attorney, Agent, or Firm*—Dilworth & Barrese LLP

(57) ABSTRACT

A direct conversion receiver having a DC offset eliminating function that eliminates a DC offset component in which an oscillator generates a local frequency signal, A first phase shifter shifts a phase of the local frequency signal from the oscillator by 90°, a first frequency mixer mixes the received radio frequency signal and the local frequency signal from the oscillator, a first low pass filter low-pass filters an output signal of the first frequency mixer, a second phase shifter shifts a phase of the received radio frequency signal by 90°, a second frequency mixer mixes output signals of the first and second phase shifters, a second low pass filter low-pass filters an output signal of the second frequency mixer, a subtracter subtracts an output signal of the second low pass filter, and a DC offset component generated by a direct conversion receiver is eliminated. Accordingly, the receiver prevents a dynamic range of the direct conversion receiver to be narrowed in order to increase a resolution thereof.

2 Claims, 4 Drawing Sheets

DIRECT CONVERSION RECEIVER HAVING A DC OFFSET ELIMINATING FUNCTION

PRIORITY

This application claims priority to an application entitled "DIRECT CONVERSION RECEIVER HAVING DC OFFSET ELIMINATING FUNCTION" filed in the Korean Industrial Property Office on Aug. 5, 2002 and assigned Serial No. 2002-46189, the contents of which are hereby incorporated by reference.

BACKGROUND OF THE INVENTION

1. Field of the Invention

The present invention relates generally to a receiver. More particularly, the present invention relates to a direct conversion receiver, which directly down-converts a received radio-frequency (RF) signal.

2. Description of the Related Art

Heterodyne receivers were used as receivers in cellular phones over the past years. However, recently, there has been a rise in the use of direct conversion receivers. In the direct conversion receiver, RF signals are converted directly into baseband signals, whereby separate intermediate frequency stages are not required.

FIG. 1 is a block diagram illustrating a construction of a conventional direct conversion receiver. As illustrated in FIG. 1, the conventional direct conversion receiver includes a low-noise amplifier (LNA) 100, a band pass filter (BPF) 102, first and second frequency mixers 110 and 106, a 90 degree phase shifter 104, and first and second low pass filters (LPF) 112 and 108. RF signals from an antenna (not shown) are directed to the LNA 100. The RF signals are amplified by the LNA 100. The amplified RF signals from the LNA 100 are band-pass filtered by the BPF 102. An output signal of the BPF 102 is divided into an in-phase (I) channel path for an in-phase (I) component and a quadrature-phase (Q) channel path for a quadrature-phase (Q) component. The in-phase (I) component and quadrature phase (Q) component are supplied to the first and second frequency mixers 110 and 106, respectively. A local frequency signal cos $\omega_{LO}t$ is directed to the first frequency mixer 110. Also, a phase of the local frequency signal cos $\omega_{LO}t$ is shifted by 90° by means of the 90 degree phase shifter 104, and the phase-shifted local frequency signal is directed to the second mixer 106. The first mixer 110 multiplies the in-phase (I) component from the BPF 102 by the local frequency signal cos $\omega_{LO}t$. The second mixer 106 multiplies the quadrature phase (Q) component from the BFP 102 by the 90° phase-shifted local frequency signal. The first LPF 112 low-pass filters an output of the first mixer 110 and outputs a down-converted in-phase signal I. The second LPF 108 low-pass filters an output of the second mixer 106 and outputs a down-converted quadrature phase signal Q. As described above, RF signals are down-converted directly into baseband signals, whereby separate intermediate frequency stages are not required.

However, as shown in FIG. 3A, in the conventional direct conversion receiver, a direct current offset component is included in outputs of the first and second mixers 110 and 106, namely, the in-phase signal I and the quadrature phase signal Q. FIG. 3A illustrates a simulation result of the conventional direct conversion receiver by means of a Hewlett Packard Advanced Design System. A code division multiple access (CDMA) signal is used as a simulation target signal. A transverse axis of FIG. 3A indicates a frequency, and the unit of the frequency is MHz. A longitudinal axis of FIG. 3A indicates a power, and the unit of the power is dBm. When analog in-phase signal I and quadrature phase signal Q are converted into digital signals by an analog-digital converter (ADC), the DC offset component included therein narrows the dynamic range of a received CDMA signal in a cellular phone.

SUMMARY OF THE INVENTION

Accordingly, the present invention has been designed to solve the above-described problems occurring in the prior art, and an object of the present invention is to provide a direct conversion receiver having a DC offset eliminating function that eliminates a DC offset component.

In order to accomplish the above and other objects, there is provided a direct conversion receiver having a direct current offset eliminating function that directly down-converts a received radio frequency signal. The direct conversion receiver comprises: an oscillator for generating a local frequency signal; a first phase shifter for shifting a phase of the local frequency signal from the oscillator by 90°; a first frequency mixer for mixing the received radio frequency signal and the local frequency signal from the oscillator; a first low pass filter for low-pass filtering an output signal of the first frequency mixer; a second phase shifter for shifting a phase of the received radio frequency signal by 90°; a second frequency mixer for mixing output signals of the first and second phase shifters; a second low pass filter for low-pass filtering an output signal of the second frequency mixer; and a subtracter for subtracting an output signal of the second low pass filter from an output signal of the first low pass filter.

There is also provided a direct conversion receiver having a direct current offset eliminating function that directly down-converts a received radio frequency signal. The direct conversion receiver comprises: an oscillator for generating a local frequency signal; a first phase shifter for shifting the phase of a local frequency signal from the oscillator by 90°; a second phase shifter for shifting the phase of a received radio frequency signal by 90°; a first frequency mixer for mixing an output signal of the second phase shifter and the local frequency signal from the oscillator; a first low pass filter for low-pass filtering an output signal of the first frequency mixer; a second frequency mixer for mixing the received radio frequency signal and an output signal of the first phase shifter; a second low pass filter for low-pass filtering an output signal of the second frequency mixer; and a subtracter for subtracting an output signal of the second low pass filter from an output signal of the first low pass filter.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Preferred embodiments of the present invention will be described herein below with reference to the accompanying FIGS. 2 to 3B. In the following description of the present invention, a detailed description of known functions and configurations incorporated herein will be omitted when it may make the subject matter of the present invention rather unclear.

Figure 1:
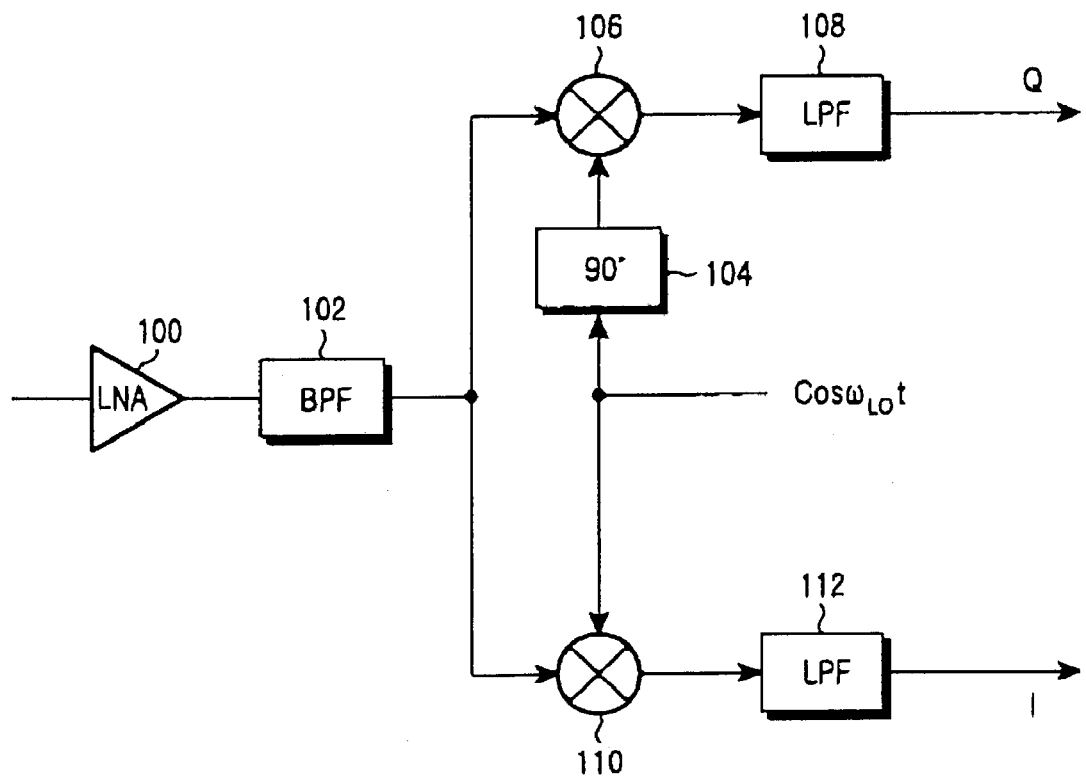
FIG. 1 is a block diagram illustrating a construction of a conventional direct conversion receiver.
Figure 2:
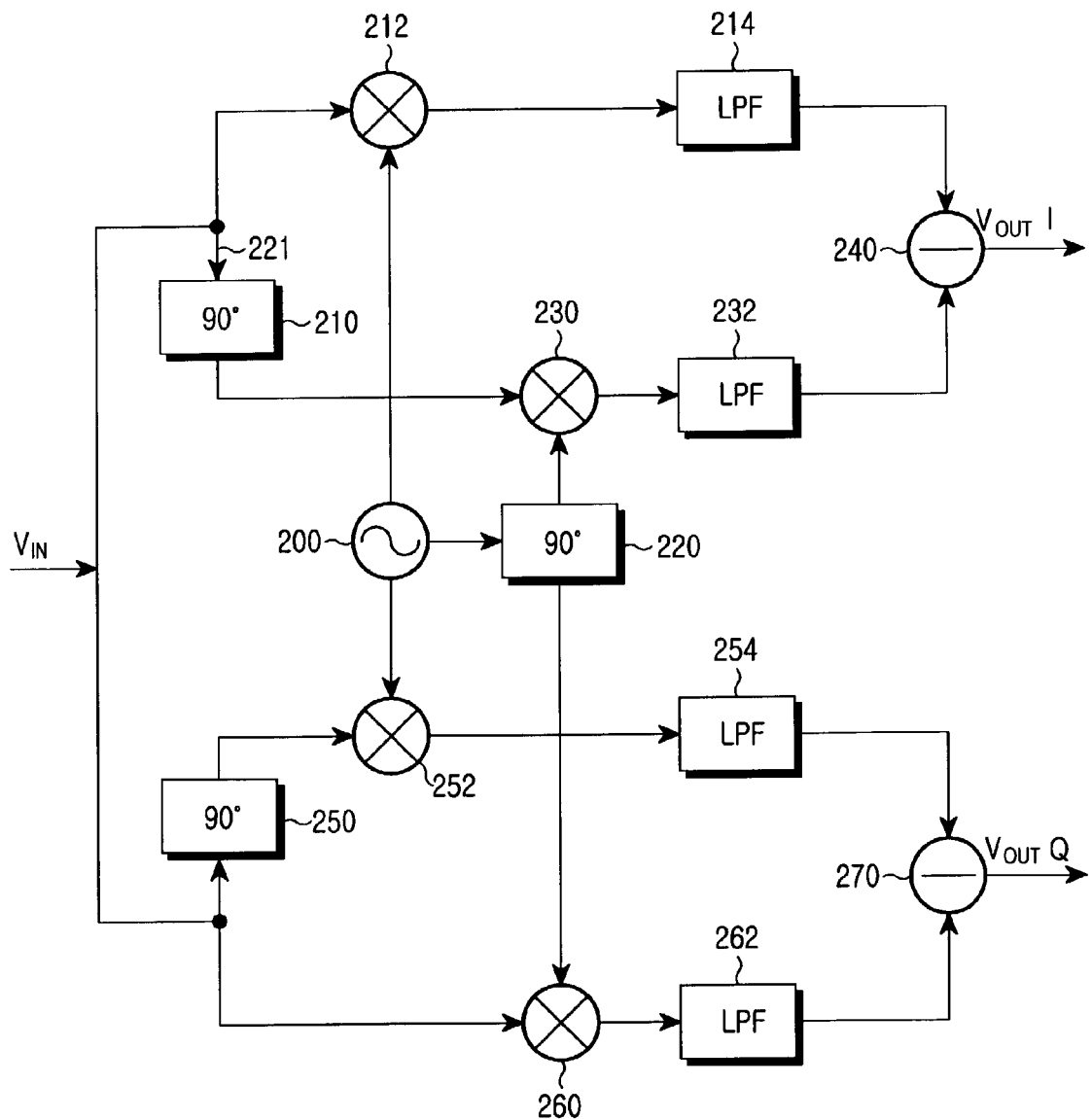
FIG. 2 is a block diagram illustrating a configuration of a direct conversion receiver having a DC offset eliminating function according to the present invention.

FIG. 2 is a block diagram illustrating a configuration of a direct conversion receiver having a DC offset eliminating function according to the present invention. The direct conversion receiver includes an oscillator 200, a first 90° phase shifter 220, a first frequency mixer 212, a first low pass filter 214, a second 90° phase shifter 210, a second frequency mixer 230, a second low pass filter 232, a first subtracter 240, a third 90° phase shifter 250, a third frequency mixer 252, a third low pass filter 254, a fourth frequency mixer 260, a fourth low pass filter 262, and a second subtracter 270.

The oscillator 200 generates a local frequency signal. The first 90° phase shifter 220 shifts a phase of the local frequency signal from the oscillator 200 by 90°. The first frequency mixer 212 mixes the received radio frequency signal and the local frequency signal from the oscillator 200. The first low pass filter 214 low-pass filters an output signal of the first frequency mixer 212. The second 90° phase shifter 210 shifts a phase of the received radio frequency signal by 90°. The second frequency mixer 230 mixes output signals of the first and second 90° phase shifters 220 and 210. The second low pass filter 232 low-pass filters an output signal of the second frequency mixer 230. The first subtracter 240 subtracts an output signal of the second low pass filter 232 from an output signal of the first low pass filter 214. The third phase shifter 250 shifts a phase of the received radio frequency signal by 90°. The third frequency mixer 252 mixes an output signal of the third phase shifter 250 and the local frequency signal from the oscillator 200. The third low pass filter 254 low-pass filters an output signal of the third frequency mixer 252. The fourth frequency mixer 260 mixes the received radio frequency signal and an output signal of the first phase shifter 220. The fourth low pass filter 262 low-pass filters an output signal of the fourth frequency mixer 260. The second subtracter 270 subtracts an output signal of the fourth low pass filter 262 from an output signal of the third low pass filter 254.

The direct conversion receiver further includes a phase control amplifier (not shown) and a phase control element (not shown) in order to compensate for the phase and the amplitude of a received RF signal.

An operation of the direct conversion receiver according to the present invention will now be explained.

The oscillator 200 generates a local frequency signal and outputs the generated local frequency signal to the first frequency mixer 212, the first 90° phase shifter 220, and the third frequency mixer 252. The third 90° phase shifter 250 shifts a phase of the received RF signal $V_{IN}$ by 90° and outputs the phase-shifted RF signal to the third frequency mixer 252. The received RF signal $V_{IN}$ is divided into an I channel path for an in-phase (I) component and a Q channel path for a quadrature phase (Q) component. The in-phase (I) component is directed to the second 90° phase shifter 210 and the first frequency mixer 212. The quadrature phase (Q) component is directed to the third 90° phase shifter 250 and the fourth frequency mixer 260. The first frequency mixer 212 mixes the radio frequency signal $V_{IN}$, which is divided into the I channel path and the local frequency signal from the oscillator 200 and outputs a mixed signal. The first low pass filter 214 low-pass filters an output signal of the first frequency mixer 212 and outputs the first low-pass filtered signal to the first subtracter 240.

The second 90° phase shifter 210 shifts the phase of the received frequency signal, which is divided into the I channel path. The second frequency mixer 230 mixes output signals of the first and second phase shifters 220 and 210 and outputs a mixed signal. The second low pass filter 232 low-pass filters an output signal of the second frequency mixer 230 and outputs a second low-pass filtered signal to the first subtracter 240.

In an output signal of the first low pass filter 214 and an output signal of the second low pass filter 232, the amplitudes of alternating current components are identical with each other, but the signs thereof are different from each other. The amplitudes and units of direct current components in the output signals of the first and second low pass filters 214 and 232 are identical with each other. The first subtracter 240 subtracts an output signal of the second low pass filter 232 from an output signal of the first low pass filter 214. Accordingly, the first subtracter 240 outputs a down-converted in-phase signal $V_{OUT}I$ wherein a DC offset component is eliminated from the received RF signal.

Also, the third 90° phase shifter 250 shifts a phase of the received frequency signal $V_{IN}$ which is divided into the Q channel path by 90° and outputs the phase-shifted signal to a third frequency mixer 252. The first, second, and third 90° phase shifters 220, 210, and 250 are embodied by using a poly-phase network. The third frequency mixer 252 mixes an output signal of the third 90° phase shifter 250 and the local frequency signal from the oscillator 200 and outputs a mixed signal to the third low pass filter 254. The third low pass filter 254 low-pass filters an output signal of the third frequency mixer 252 and outputs a third low-pass filtered signal to the second subtracter 270. The second subtracter 270 subtracts an output signal of the fourth low pass filter 262 from an output signal of the third low pass filter 254. Accordingly, the second subtracter 270 outputs a down-converted quadrature phase signal $V_{OUT}Q$ wherein a DC offset component is eliminated from the received RF signal.

As described above, the direct conversion receiver according to the present invention generates a pair of RF signals having alternating current components with amplitudes that are identical with each other and signs that are different from each other. The two RF signals are converted into signals having only the alternating current component wherein a DC offset component is eliminated from the RF signal.

Output processes of an in-phase signal $V_{OUT}I$ and a quadrature signal $V_{OUT}Q$ wherein the DC offset component is eliminated from the received RF signal will be described using the following equations.

An I channel is explained as follows with the local frequency signal from the oscillator 200 referred to as $V_{LO}(t)$ and the received RF signal referred to as $V_{RF}(t)$. The local frequency signal $V_{LO}(t)$ and the received RF signal $V_{RF}(t)$ are expressed by Equations 1 and 2, respectively. A represents an amplitude.

$$V_{LO}(t) = A_1 \cos \omega_{LO} t \qquad \text{Equation 1}$$

$$V_{RF}(t) = A_1 \cos \omega_{RF} t \qquad \text{Equation 2}$$

A signal obtained by shifting a phase of the RF signal $V_{RF}(t)$ (and expressed by the Equation 2) by 90° by means of a 90° phase shifter 210 is referred to as $V_{RF2}(t)$. The 90° phase-shifted RF signal $V_{RF2}(t)$ is expressed Equation 3.

$$V_{RF2}(t) = A_1 \cos\left(\omega_{RF} t - \frac{\pi}{2}\right) = A_1 \sin\omega_{RF} t \qquad \text{Equation 3}$$

A signal obtained by shifting a phase of the local frequency signal $V_{LO}(t)$ by 90° by means of a 90° phase shifter 220 and expressed Equation 1 is referred to as $V_{LO2}(t)$. The 90° phase-shifted signal $V_{LO2}(t)$ is expressed by Equation 4.

$$V_{LO2}(t) = A_2 \cos\left(\omega_{LO} t - \frac{\pi}{2}\right) = A_2 \sin\omega_{LO} t \qquad \text{Equation 4}$$

A theoretical output signal of the first frequency mixer 212 is referred to as $V_{LO}(t)$ wherein the local frequency signal $V_{LO}(t)$ expressed by the equation 1 and the RF signal $V_{RF}(t)$ expressed by the equation 2 are directed to the first frequency mixer 212. The theoretical output signal $V_1(t)$ of the first frequency mixer 212 is expressed by Equation 5.

$$V_1(t) = A_1 \cos \omega_{RF} t + A_2 \cos \omega_{LO} t \qquad \text{Equation 5}$$

However, since the first frequency mixer 212 is a non-linear element, a real output signal $V_o(t)$ of the first frequency mixer 212 is given by $V_o(t) = kV_i^2(t)$. Accordingly, the real output signal $V_o(t)$ of the first frequency mixer 212 is expressed by Equation 6. That is, two input signals are passed through a non-linear function to output a non-linear component of a plurality of degrees. k represents a proportional factor.

$$V_{o1}(t) = k[A_1\cos\omega_{RF}t + A_2\cos\omega_{LO}t]^2 \qquad \text{Equation 6}$$
$$= k[A_1^2\cos^2\omega_{RF}t + A_2^2\cos^2\omega_{LO}t + 2A_1A_2\cos\omega_{RF}t\cos\omega_{LO}t]$$
$$= k\{\frac{A_1^2 + A_2^2}{2} + \frac{A_1^2\cos2\omega_{RF}t}{2} + \frac{A_2^2\cos2\omega_{LO}t}{2} +$$
$$A_1A_2\cos(\omega_{RF} + \omega_{LO})t + A_1A_2\cos(\omega_{RF} - \omega_{LO})t\}$$

A signal obtained by low-pass filtering an output signal of the first frequency mixer 212 (and expressed by Equation 6) by means of a low first pass filter 214 is expressed by Equation 7.

$$V_{o1,LPF} = k\frac{A_1^2 + A_2^2}{2} + kA_1A_2\cos(\omega_{RF} + \omega_{LO})t \qquad \text{Equation 7}$$

In Equation 7, $$k\frac{A_1^2 + A_2^2}{2}$$

is a direct current component in the low-pass filtered signal of the first low pass filter 214 and $kA_1A_2 \cos(\omega_{RF}-\omega_{LO})t$ is an alternating current component therein. The second frequency mixer 230 receives output signals of the first 90° phase shifters 220 and 210 expressed by the equations 3 and 4, respectively. A theoretical output signal of the second frequency mixer 230 is theoretically expressed by Equation 8. However, a real output signal of the second frequency mixer 230 is expressed by Equation 9 due to a non-linear operation.

$$V_2(t) = A_1 \sin \omega_{RF} t + A_2 \sin \omega_{LO} t \qquad \text{Equation 8}$$

$$V_{o2}(t) = k[A_1\sin\omega_{RF}t + A_2\sin\omega_{LO}t]^2 \qquad \text{Equation 9}$$
$$= k[A_1^2\sin^2\omega_{RF}t + A_2^2\sin^2\omega_{LO}t + 2A_1A_2\sin\omega_{RF}t\sin\omega_{LO}t]$$

-continued $$= k\{\frac{A_1^2 + A_2^2}{2} - \frac{A_1^2\cos 2\omega_{RF}t}{2} - \frac{A_2^2\cos 2\omega_{LO}t}{2} +$$
$$A_1A_2\cos(\omega_{RF} + \omega_{LO})t - A_1A_2\cos(\omega_{RF} - \omega_{LO})t\}$$

A second low pass filter 232 low-pass filtering the output signal of the second frequency mixer 230 expressed by the equation 9 outputs a signal $V_{o2, LPF}$ expressed by Equation 10.

$$V_{o2,LPF} = k\frac{A_1^2 + A_2^2}{2} - kA_1A_2\cos(\omega_{RF} - \omega_{LO})t \quad \text{Equation 10}$$

In equation 10, $$k\frac{A_1^2 + A_2^2}{2}$$

is a direct current component in the output signal of the second low pass filter 232 and $kA_1A_2 \cos(\omega_{RF-\omega LO})t$ is an alternating current component therein.

When comparing an output signal of a first low pass filter 214 expressed by Equation (7) with an output signal of a second low pass filter 232 expressed by Equation (10), amplitudes of alternating current components in the output signals of the first and second low pass filters 214 and 232 are identical with each other, but the signs thereof are different from each other. Amplitudes and signs of direct current components therein are identical with each other. When the output signals of the first and second low pass filters 214 and 232 are input to a subtracter 240, the subtracter 240 subtracts the output signal of the second low pass filter 232 from the output signal of the first low pass filter 214. Accordingly, an in-phase signal $V_{OUT}I$ is output. The in-phase signal $V_{OUT}I$ includes only the alternating current component $kA_1 A_2 \cos(\omega_{RF}-\omega_{LO})t$. The direct current component is eliminated from the received RF signal. The in-phase signal $V_{OUT}I$ is expressed by Equation 11.

$$V_{IF,In-phase} = V_{o1,LPF} - V_{o2,LPF} \quad \text{Equation 11}$$
$$= 2kA_1A_2\cos(\omega_{RF} - \omega_{LO})t$$

Also, a Q channel will be explained. A quadrature phase signal $V_{OUT}Q$ wherein a DC offset component is eliminated from the received RF signal is obtained and is expressed by Equation 12, using the same method as that in the in-phase signal I.

$$V_{IF,Quadrature-phase} = V'_{o1,LPF} - V'_{o2,LPF} \quad \text{Equation 12}$$
$$= 2kA_1A_2\sin(\omega_{RF} - \omega_{LO})t$$

Since the equation 12 can be easily obtained with reference to the equations 1 to 11, the induction process of the quadrature phase signal $V_{OUT}Q$ will be omitted. Meanwhile, parameters and constants employed in the above equations represent characteristics of each system, and it is understood that they do not restrict the scope of the invention.

Figure 3A:
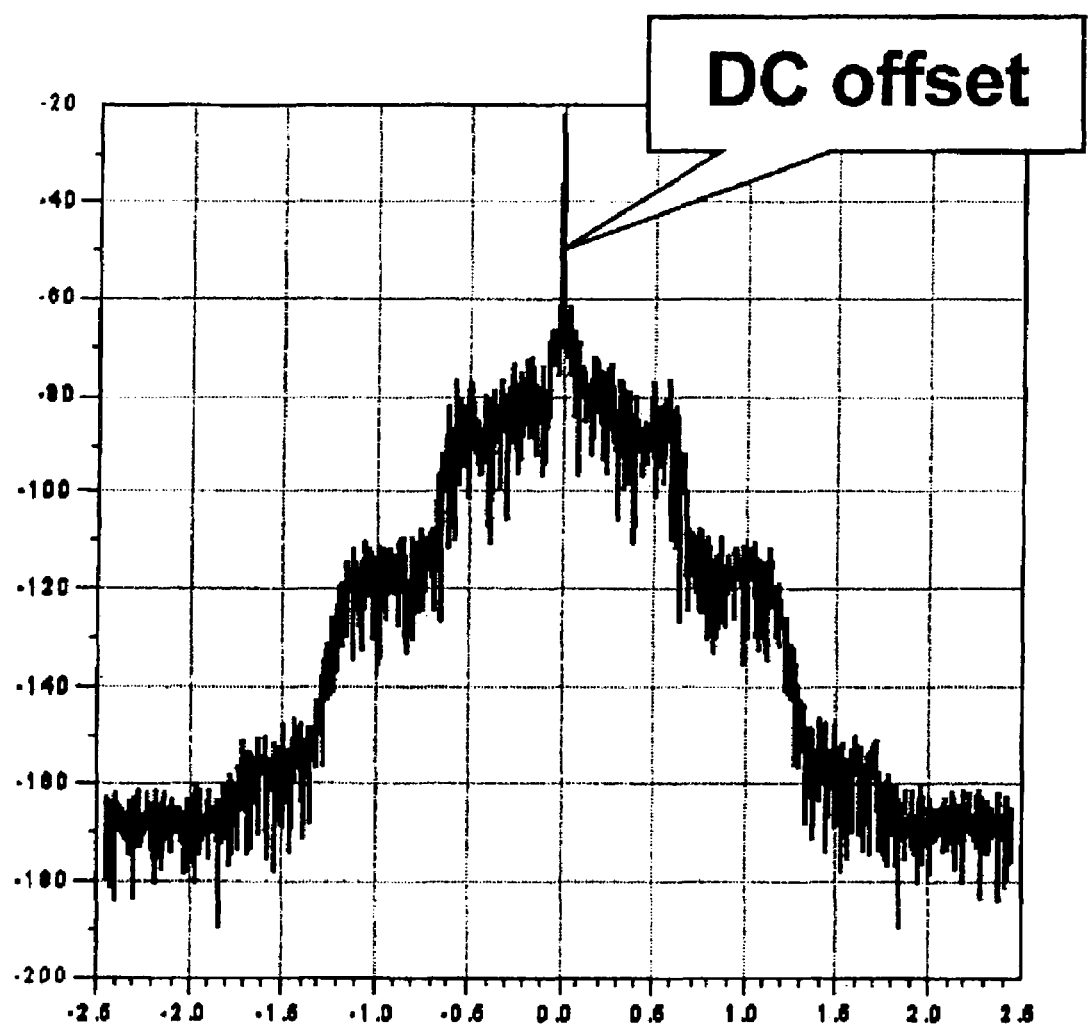
FIG. 3A illustrates a simulation result of the conventional direct conversion receiver illustrated in FIG. 1.
Figure 3B:
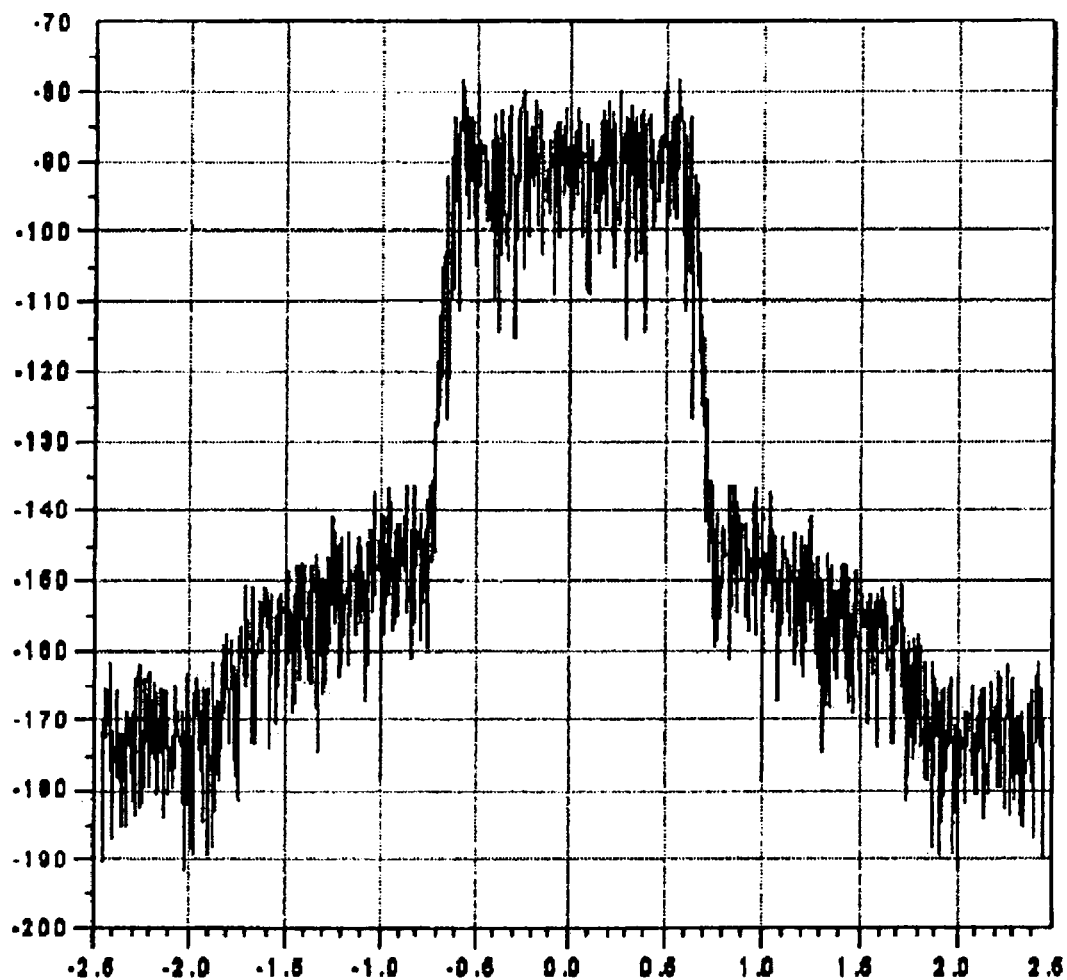
FIG. 3B illustrates a simulation result of the direct conversion receiver according the present invention illustrated in FIG. 2.

FIG. 3B illustrates a simulation result of the direct conversion receiver according to the present invention illustrated in FIG. 2. When comparing FIG. 3B with FIG. 3A, FIG. 3B shows a CDMA signal which has an alternating current component and the DC offset is eliminated from the CDMA signal. A CDMA signal is used as a simulation target signal. A transverse axis of FIG. 3B indicates a frequency, and an unit of the frequency is MHz.

According to the present invention as mentioned above, a DC offset component generated by a direct conversion receiver is eliminated. Accordingly, it prevents a dynamic range of the direct conversion receiver from being narrowed in order to increase a resolution thereof.

While the invention has been shown and described with reference to certain preferred embodiments thereof, it will be understood by those skilled in the art that various changes in form and details may be made therein without departing from the spirit. Specifically, although the above description is given to the case where an RF signal is divided into I and Q channels, thereby outputting a down-converted in-phase signal $V_{OUT}I$, the same can be applied to the direct conversion receivers. Therefore, the scope of the invention as defined is not limited by the above-described embodiments but only by the appended claims

What is claimed is:

1. A direct conversion receiver having a direct current offset eliminating function which directly down-converts a received radio frequency signal, the direct conversion receiver comprising:

an oscillator for generating a local frequency signal;
a first phase shifter for shifting a phase of the local frequency signal from the oscillator by 90°;
a first frequency mixer for mixing the received radio frequency signal and the local frequency signal from the oscillator;
a first low pass filter for low-pass filtering on output signal of the first frequency mixer;
a second phase shifter for shifting a phase of the received radio frequency signal by 90°;
a second frequency mixer for mixing output signals of the first and second phase shifters;
a second low pass filter for low-pass filtering an output signal of the second frequency mixer;
a subtracter for subtracting an output signal of the second low pass filter from an output signal of the first low pass and outputting an in-phase (I) signal of the down-converted radio frequency signal where direct current (DC) components are eliminated; and
wherein the output signals of the first and second frequency mixers includes a non-linear component of a plurality of degrees, and the output signals of the first and second low pass filters include direct current (DC) components of identical amplitudes and sign and include alternating current components of identical amplitude and different signs.

2. A direct conversion receiver having a direct current offset eliminating function that directly down-converts a received radio frequency signal, the direct conversion receiver comprising:
- an oscillator for generating a local frequency signal;
- a first phase shifter for shifting a phase of the local frequency signal from the oscillator by 90°;
- a second phase shifter for shifting a phase of the received radio frequency signal by 90°;
- a first frequency mixer for mixing an output signal of the second phase shifter and the local frequency signal from the oscillator;
- a first low pass filter for low-pass filtering an output signal of the first frequency mixer;
- a second frequency mixer for mixing the received radio frequency signal and an output signal of the first phase shifter;
- a second low pass filter for low-pass filtering an output signal of the second frequency mixer;
- a subtracter for subtracting an output signal of the second low pass filter from an output signal of the first low pass filter and outputting a quadrature-phase (Q) signal of the down-converted radio frequency signal where direct current (DC) components are eliminated; and
- wherein the output signals of the first and second frequency mixers include a non-linear component of a plurality of degrees, and the output signals of the first and second low pass filters include direct current (DC) components of identical amplitudes and sign and include alternating current components of identical amplitude and different signs.

* * * * *